US011229131B2

(12) United States Patent
Amin et al.

(10) Patent No.: US 11,229,131 B2
(45) Date of Patent: Jan. 18, 2022

(54) ENCLOSURES HAVING AN ANTI-FINGERPRINT SURFACE

(71) Applicant: CORNING INCORPORATED, Corning, NY (US)

(72) Inventors: Jaymin Amin, Corning, NY (US); Jaques Gollier, Redmond, WA (US); Shandon Dee Hart, Corning, NY (US); Karl William Koch, III, Elmira, NY (US); Wageesha Senaratne, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 261 days.

(21) Appl. No.: 15/544,630

(22) PCT Filed: Jan. 19, 2016

(86) PCT No.: PCT/US2016/013823
§ 371 (c)(1),
(2) Date: Jul. 19, 2017

(87) PCT Pub. No.: WO2016/118462
PCT Pub. Date: Jul. 28, 2016

(65) Prior Publication Data
US 2018/0352668 A1    Dec. 6, 2018

Related U.S. Application Data

(60) Provisional application No. 62/105,004, filed on Jan. 19, 2015.

(51) Int. Cl.
*H05K 5/02*    (2006.01)
*H05K 5/00*    (2006.01)
(Continued)

(52) U.S. Cl.
CPC ............. *H05K 5/0217* (2013.01); *B24C 1/00* (2013.01); *B24C 1/04* (2013.01); *B24C 3/322* (2013.01);
(Continued)

(58) Field of Classification Search
CPC .... H05K 5/0217; H05K 5/0086; C03C 19/00; C03C 15/00; G06F 1/1656
See application file for complete search history.

(56) References Cited

U.S. PATENT DOCUMENTS 8,187,987 B2    5/2012  Amin et al.
9,296,905 B2    3/2016  Pokorny et al.
(Continued)

FOREIGN PATENT DOCUMENTS

CN    102089252 A    6/2011
CN    102123960 A    7/2011
(Continued)

OTHER PUBLICATIONS

English Translation of JP2017537933 Office Action dated Jun. 12, 2019, Japan Patent Office, 4 Pgs.
(Continued)

*Primary Examiner* — Laura A Auer
(74) *Attorney, Agent, or Firm* — Payal A. Patel; Jeffrey A. Schmidt

(57) ABSTRACT

Embodiments of an enclosure including a substrate having an anti-fingerprint surface are disclosed. The anti-fingerprint surface may include a textured surface, a coated surface or a coated textured surface that exhibits a low fingerprint visibility, when a fingerprint is applied to the anti-fingerprint surface. In one or more embodiments, the enclosure exhibits any one of the following attributes (1) radio, and microwave frequency transparency, as defined by a loss tangent of less than 0.03 and at a frequency range of between 15 MHz to 3.0
(Continued)

GHz; (2) infrared transparency; (3) a fracture toughness of greater than 0.6 MPa·m$^{1/2}$; (4) a 4-point bend strength of greater than 350 MPa; (5) a Vickers hardness of at least 450 kgf/mm$^2$ and a Vickers median/radial crack initiation threshold of at least 5 kgf; (6) a Young's Modulus in the range from about 50 GPa to about 100 GPa; and (7) a thermal conductivity of less than 2.0 W/m° C.

21 Claims, 7 Drawing Sheets

(51) Int. Cl.

| | | |
|---|---|---|
| *C03C 3/091* | (2006.01) | |
| *C03C 15/00* | (2006.01) | |
| *B24C 3/32* | (2006.01) | |
| *C09D 5/00* | (2006.01) | |
| *G06F 1/16* | (2006.01) | |
| *C03C 3/083* | (2006.01) | |
| *B24C 1/04* | (2006.01) | |
| *C03C 21/00* | (2006.01) | |
| *B24C 1/00* | (2006.01) | |
| *C03C 19/00* | (2006.01) | |

(52) U.S. Cl.
CPC .............. *C03C 3/083* (2013.01); *C03C 3/091* (2013.01); *C03C 15/00* (2013.01); *C03C 19/00* (2013.01); *C03C 21/002* (2013.01); *C09D 5/00* (2013.01); *G06F 1/1656* (2013.01); *H05K 5/0086* (2013.01); *C03C 2218/31* (2013.01)

(56) References Cited

U.S. PATENT DOCUMENTS

| | | | | |
|---|---|---|---|---|
| 2009/0041984 | A1* | 2/2009 | Mayers .................... | G02B 1/18 428/141 |
| 2010/0047521 | A1* | 2/2010 | Amin ....................... | C03C 3/083 428/141 |
| 2012/0174823 | A1* | 7/2012 | Ham .................... | C09D 5/1675 106/287.14 |
| 2012/0321882 | A1* | 12/2012 | Asai ........................ | B32B 27/16 428/339 |
| 2013/0142994 | A1 | 6/2013 | Wang et al. | |
| 2013/0149496 | A1* | 6/2013 | Mazumder .............. | G06F 3/041 428/143 |
| 2014/0061510 | A1* | 3/2014 | Twitchen ................ | C30B 29/04 250/492.1 |
| 2014/0134397 | A1 | 5/2014 | Amin et al. | |
| 2014/0178642 | A1* | 6/2014 | Milanovska ............ | C03C 17/34 428/143 |
| 2014/0336039 | A1 | 11/2014 | Cohen et al. | |
| 2017/0120294 | A1 | 5/2017 | Portet et al. | |

FOREIGN PATENT DOCUMENTS

| | | | | |
|---|---|---|---|---|
| CN | 102896839 | A | 1/2013 | |
| CN | 103249784 | A | 8/2013 | |
| DE | 202012012372 | U1 * | 1/2013 | .............. F24C 15/10 |
| JP | 2007173585 | A | 7/2007 | |
| JP | 2012-500177 | A | 1/2012 | |
| JP | 2014215509 | A | 11/2014 | |
| TW | 201337316 | A | 9/2013 | |
| WO | 2010002477 | A1 | 1/2010 | |
| WO | 2014/012003 | A2 | 1/2014 | |
| WO | 2014/012004 | A2 | 1/2014 | |

OTHER PUBLICATIONS

Chinese Patent Application No. 201680016489.9; English Translation of the First Office Action dated Aug. 15, 2019; China Patent Office; 17 Pgs.

Taiwanese Patent Application No. 105101569; English Translation of the Office Action and Search Report dated Aug. 26, 2019; Taiwan Patent Office; 3 Pgs.

Taiwanese Patent Application No. 105101569; Office Action dated Nov. 9, 2020; 6 Pages; Taiwan Patent Office.

Chinese Patent Application No. 201680016489.9, Office Action dated Oct. 15, 2019, 21 Pages (13 pages of English Translation and 8 pages of Original Document); Chinese Patent Office.

International Search Report and Written Opinion of the International Searching Authority; PCT/US16/13823; dated Aug. 3, 2016; 13 Pages; European Patent Office.

European Patent Application No. 16706693.5 Communication pursuant to Article 94(3) EPC dated Feb. 25, 2021; 4 Pages; European Patent Office.

\* cited by examiner

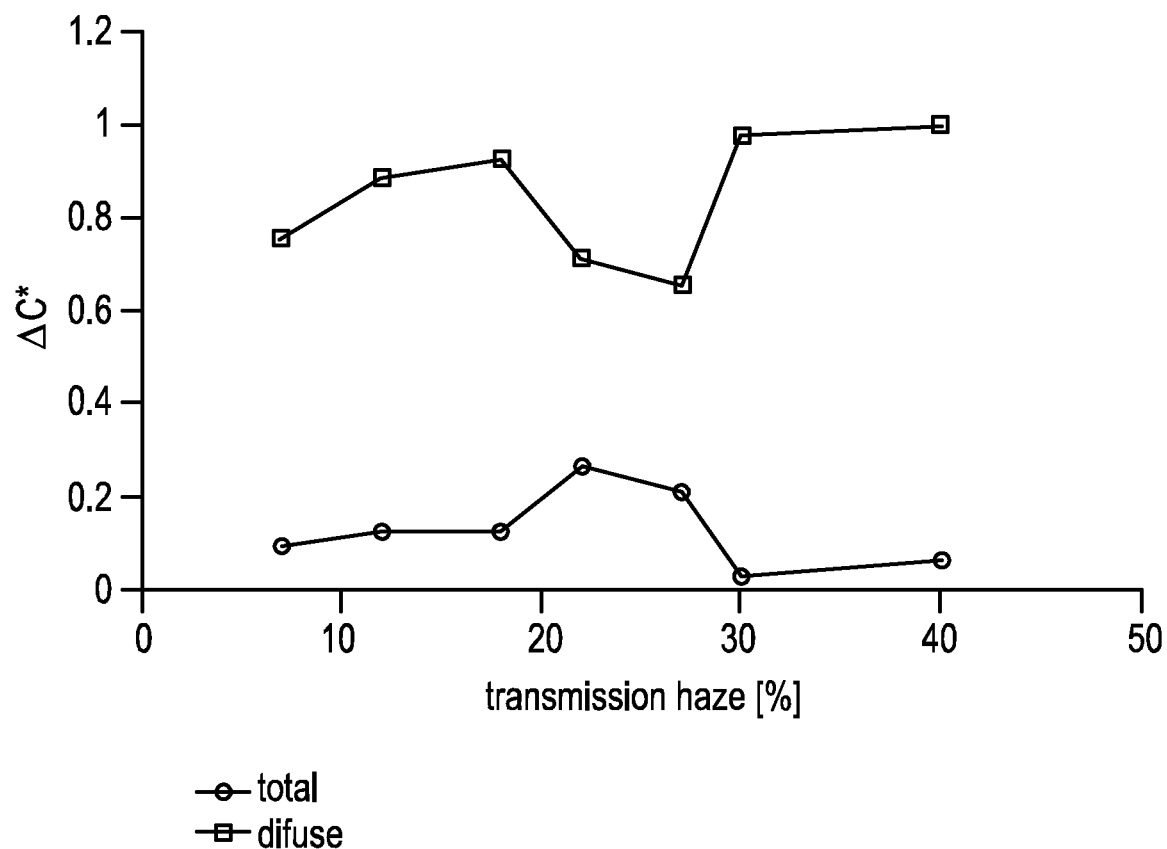

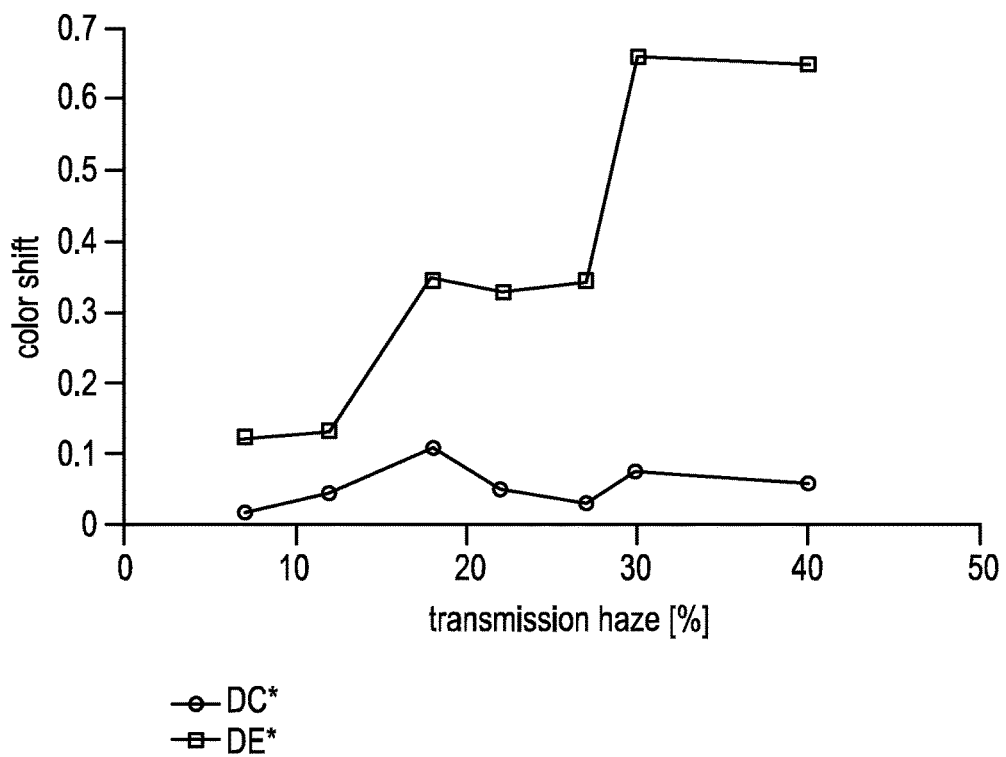

ENCLOSURES HAVING AN ANTI-FINGERPRINT SURFACE

CROSS-REFERENCE TO RELATED APPLICATIONS

This application is a national stage entry of International Patent Application Serial No. PCT/US16/13823, filed on Jan. 19, 2016, which in turn, claims the benefit of priority under 35 U.S.C. § 119 of U.S. Provisional Application Ser. No. 62/105,004 filed on Jan. 19, 2015, the contents of each of which are relied upon and incorporated herein by reference in their entireties.

TECHNICAL FIELD

This disclosure relates to enclosures for electronic devices and more particularly to enclosures including an anti-fingerprint surface that permits transmission of wireless data transmission or wireless charging energy therethrough.

BACKGROUND

As portable electronic devices such as laptops, tablets, media players, and mobile phones have become smaller, lighter in weight and more powerful, the design of some components and enclosures of the portable computing devices must be improved. This design of such enclosures should be lighter in weight and thinner, but strong and rigid. The lighter weight enclosures, which typically use thin plastic structures and few fasteners, tend to be more flexible, are prone to scratching, and have a greater tendency to buckle and bow as opposed to stronger and more rigid enclosures which typically use thicker plastic structures and more fasteners which are thicker and have more weight. The increased weight of the stronger and more rigid structures may lead to user dissatisfaction, and bowing/buckling of the lighter weight structures may damage the internal parts of the portable electronic devices.

From an aesthetic standpoint, surfaces which are resistant to the transfer or smudging of fingerprints are desired in enclosures. For applications related to electronic devices, the general requirements for such surfaces include high transmission, controlled haze, resistance to fingerprint transfer, and robustness to handling. A fingerprint-resistant surface must be resistant to both water and oil transfer when touched by a finger or skin of a user.

In view of the foregoing problems with existing enclosures, there is a need for improved enclosures for portable electronic devices. In particular, there is a need for enclosures that are more cost effective, smaller, lighter, stronger and aesthetically more pleasing than current enclosure designs.

SUMMARY

A first aspect of this disclosure pertains to an electronic device enclosure including a substrate with an anti-fingerprint surface. In one or more embodiments, when a fingerprint is applied to the anti-fingerprint surface, the anti-fingerprint surface exhibits a visibility of less than about 0.95 or a color shift of less than about 20. In some embodiments, when a fingerprint is applied to the anti-fingerprint surface, the anti-fingerprint surface exhibits both a visibility of less than about 0.95 or a color shift of less than about 20. The anti-fingerprint surface may include a textured surface, a coated surface or a coated textured surface. The textured surface may include a RMS roughness height in the range from about 0.05 micrometers to about 10 micrometers, a lateral spatial period in the range from about 0.1 micrometers to about 500 microns, or a combination of a RMS roughness height in the range from about 0.05 micrometers to about 10 micrometers and a lateral spatial period in the range from about 0.1 micrometers to about 500 microns.

In some embodiments, the enclosure exhibits a haze (in transmittance or reflectance) in the range from about 0.5% to about 40%. The enclosure may exhibit an average transmittance of about 80% or greater over a wavelength range from about 400 nm to about 750 nm. In other embodiments, the enclosure may exhibit an average transmittance of about 80% or greater over a wavelength range from about 750 nm to about 2000 nm.

The enclosure may exhibit properties enabling the enclosure to be used with electronic devices. Such properties may include any one or more of: radio and microwave frequency transparency, as defined by a loss tangent of less than 0.03 and at a frequency range of between 15 MHz to 3.0 GHz; magnetic field transparency, inductive field transparency, and infrared transparency. In some embodiments, the enclosure exhibits radio and microwave frequency transparency, as defined by a loss tangent of less than 0.015 at a frequency range of between 500 MHz to 3.0 GHz.

In one or more embodiments, the enclosure may exhibit various mechanical properties enabling the use of the enclosure with portable electronic devices. The mechanical properties include any one or more of: a fracture toughness of greater than 0.60 MPa·m$^{1/2}$ (or greater than 0.75 MPa·m$^{1/2}$), a 4-point bend strength of greater than 350 MPa or greater than 475 MPa, a Vickers hardness of at least 450 kgf/mm$^2$ or at least 500 kgf/mm$^2$, a Vickers median/radial crack initiation threshold of at least 5 kgf or about 10 kgf, a Young's Modulus in the range from about 50 GPa to about 100 GPa (or in the range from about 50 GPa to about 75 GPa), and a thermal conductivity of less than 2.0 W/m° C. or less than 1.5 W/m° C.

The substrate utilized in the enclosure may include an amorphous substrate or a crystalline substrate. Examples of amorphous substrates include soda lime glass, an alkali aluminosilicate glass, an alkali containing borosilicate glass and an alkali aluminoborosilicate glass. In some instances, the amorphous substrate may be strengthened. In one or more embodiments, the strengthened amorphous substrate may exhibit any one or more of: a compressive surface layer having a depth of layer (DOL) greater than or equal to 20 μm, a compressive stress greater than 400 MPa, and a central tension of more than 20 MPa. Examples of crystalline substrates include strengthened glass ceramic substrate, a non-strengthened glass-ceramic, or a single crystal substrates. Such strengthened crystalline substrate may exhibit any one or more of: a compressive surface layer having a depth of layer (DOL) greater than or equal to 20 μm, a compressive stress greater than 400 MPa, and a central tension of more than 20 MPa.

A second aspect of the instant disclosure pertains to an electronic device including a housing, electrical components disposed at least partially inside the housing and a glass-based. In one or more embodiments, the electronic components may include at least a controller, a memory, and a display, and wherein the glass-based substrate is disposed over the display or behind the display. In one or more embodiments, the glass-based substrate is strengthened and includes a surface and a compressive stress extending from the surface to a depth of layer (DOL) of about 20 micrometers or greater. In one or more embodiments, the glass-based substrate exhibits a transmittance over the visible spectrum of less than about 80%.

The glass-based substrate of one or more embodiments comprises a transmission haze greater than about 20%. In some instances, the glass-based substrate comprises a reflection haze at either 2 degrees from specular or 5 degrees from specular greater than 20%. The transmission and reflection haze may be measured according to ASTM E430.

In some instances, the glass-based substrate exhibits a coefficient of friction less than about 0.3, when measured against a silicon carbide sphere counter surface. In one or more embodiments, the glass-based substrate exhibits an RMS surface roughness greater than about 200 nm or greater than about 500 nm, as measured at a major surface.

In one or more embodiments, the glass-based substrate incudes an ink layer disposed a major surface of the glass-based substrate. In some instances, the glass-based substrate includes a hydrophobic or oleophobic material. The glass-based substrate may include a colored glass or exhibit a color.

The electronic device enclosure may include an electronic device selected from a mobile phone, a tablet, a laptop or notebook computer, and a media player.

BRIEF DESCRIPTION OF DRAWINGS

FIG. 6 is a graph plotting the total reflectance color shift versus transmittance haze and diffuse reflectance color shift versus transmittance haze, of the enclosures shown in FIG. 2; and FIG. 7 is a graph plotting the total transmission color shift versus transmittance haze and total transmittance color shift, taking into account color value L*, versus transmittance haze, of the enclosures shown in FIG. 2;

DETAILED DESCRIPTION

As is described herein below, there is a need for more cost effective, smaller, lighter, stronger and aesthetically more pleasing enclosures for portable electronic devices. Such devices may include mobile phones, media (including music) players, laptop or notebook computers, tablets, gaming devices, electronic book readers and other devices. Embodiments of this disclosure pertain to suitable materials for such enclosures, which exhibit weight and/or resistance to impact damage (e.g., denting) and include an anti-fingerprint surface. Unlike many of the known materials used for enclosures, in particular metallic enclosures, the materials described herein do not interfere with wireless communications. For example, the enclosure may permit transmission of radio frequency, microwaves, magnetic fields, inductive fields, wireless data transmission, wireless charging energy or combinations thereof. Some embodiments of this disclosure pertain to electronic devices including the enclosures described herein.

Figure 1:
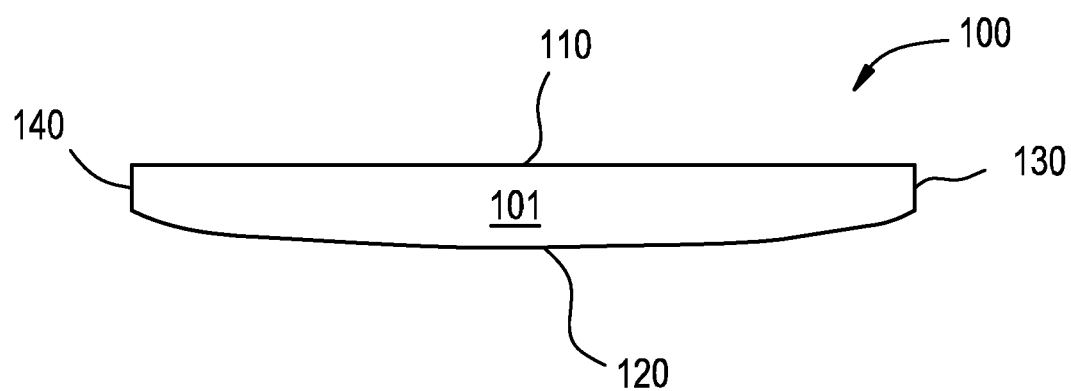
FIG. 1 is a side view of an enclosure according to one or more embodiments.

The embodiments herein pertain to enclosures including a substrate having an anti-fingerprint surface. As used herein the terms "enclosure" may be used interchangeably with "housing" and "cover or protective cover". As shown in FIG. 1, the enclosure 100 that includes a substrate 101 with opposing major surfaces, 110, 120 and opposing minor surfaces 130, 140, though other configurations are possible, as will be discussed below with respect to the substrate. In some embodiments, the enclosure covers non-display areas or components of an electronic device. Such enclosures form a back surface of an electronic device and/or any of the edges of the electronic device. In one or more embodiments, one major surface 120 of the substrate may form an exterior surface of the electronic device and the other major surface 110 may form an interior surface of the enclosure and is adjacent to internal components of the electronic device. The major surface 110 forming the interior surface may include a coating forming a decorative feature, which may include a coating imparting a color, graphic, metallized surface and the like.

As used herein, the term "anti-fingerprint" generally relates to a reduction in the visibility of fingerprints on a surface. Such reduction may be achieved by imparting hydrophobicity (i.e., contact angle of water>90°) to a surface, oleophilicity (i.e., contact angle of oil<90°) to a surface, and resistance to adherence of particulate or liquid matter found in fingerprints to a surface, or a combination thereof. In some embodiments, these properties stick may be imparted to a surface by various surface modifications, coatings or a combination thereof.

Substrate

In one more embodiments, the substrate may include an amorphous substrate, a crystalline substrate, or a combination thereof. In some embodiments, the substrate may be characterized as inorganic, or more specifically, glass-based. In one or more embodiments, the amorphous substrate may include a glass substrate, which may be strengthened or non-strengthened. Examples of suitable glass substrates include soda lime glass substrates, alkali aluminosilicate glass substrates, alkali containing borosilicate glass substrates and alkali aluminoborosilicate glass substrates. In some variants, the glass substrates may be free of lithia. In one or more alternative embodiments, the substrate 110 may include crystalline substrates such as glass-ceramic substrates (which may be strengthened or non-strengthened) or may include a single crystal structure, such as sapphire. In one or more specific embodiments, the substrate includes an amorphous base (e.g., glass) and a crystalline cladding (e.g., sapphire layer, a polycrystalline alumina layer and/or or a spinel ($MgAl_2O_4$) layer).

In some embodiments, the substrate 110 may be organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

The substrate may be substantially planar, although other embodiments may utilize a curved or otherwise shaped or sculpted substrate (e.g., having a 2.5-dimensional or 3-dimensional shape). The substrate may be substantially optically clear, transparent and free from light scattering. The substrate may have a refractive index in the range from about 1.45 to about 1.55. As used herein, the refractive index values are with respect to a wavelength of 550 nm. The substrate may be characterized as having a high average flexural strength (when compared to substrates that are not strengthened, as described herein) or high surface strain-to-failure (when compared to substrates that are not strengthened, as described herein) as measured on one or more major opposing surfaces of such substrates.

In one or more embodiments, the substrate may exhibit a color or may be a colored substrate (i.e., a substrate that appears to have a color or shade. Where glass-based substrates are utilized, the glass-based substrate may include a composition with a colorant such as oxides of cobalt, vanadium, copper, iron, nanganese and the like.

Additionally or alternatively, the thickness of the substrate may vary along one or more of its dimensions for aesthetic and/or functional reasons. For example, the edges of the substrate may be thicker as compared to more central regions of the substrate. The length, width and thickness dimensions of the substrate may also vary according to the enclosure application or use.

The substrate may be provided using a variety of different processes. For instance, where the substrate includes a glass substrate, exemplary glass substrate forming methods include float glass processes and down-draw processes such as fusion draw and slot draw.

A glass substrate prepared by a float glass process may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass substrate that can be lifted from the tin onto rollers. Once off the bath, the glass substrate can be cooled further and annealed to reduce internal stress.

Down-draw processes produce glass substrates having a uniform thickness that possess relatively pristine surfaces. Because the average flexural strength of the glass substrate is controlled by the amount and size of surface flaws, a pristine surface that has had minimal contact has a higher initial strength. When this high strength glass substrate is then further strengthened (e.g., chemically), the resultant strength can be higher than that of a glass substrate with a surface that has been lapped and polished. Down-drawn glass substrates may be drawn to a thickness of less than about 2 mm. In addition, down drawn glass substrates have a very flat, smooth surface that can be used in its final application without costly grinding and polishing.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass substrate. The fusion draw method offers the advantage that, because the two glass films flowing over the channel fuse together, neither of the outside surfaces of the resulting glass substrate comes in contact with any part of the apparatus. Thus, the surface properties of the fusion drawn glass substrate are not affected by such contact.

The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous substrate and into an annealing region.

In some embodiments, the compositions used for the glass substrate may be batched with 0-2 mol. % of at least one fining agent selected from a group that includes $Na_2SO_4$, NaCl, NaF, NaBr, $K_2SO_4$, KCl, KF, KBr, and $SnO_2$.

Once formed, a glass substrate may be strengthened to form a strengthened glass substrate. It should be noted that glass ceramic substrates may also be strengthened in the same manner as glass substrates. As used herein, the term "strengthened substrate" may refer to a glass substrate or a glass ceramic substrates that has been chemically strengthened, for example through ion-exchange of larger ions for smaller ions in the surface of the glass or glass ceramic substrate. However, other strengthening methods known in the art, such as thermal tempering, may be utilized to form strengthened glass substrates.

The strengthened substrates described herein may be chemically strengthened by an ion exchange process. In the ion-exchange process, typically by immersion of a glass or glass ceramic substrate into a molten salt bath for a predetermined period of time, ions at or near the surface(s) of the glass or glass ceramic substrate are exchanged for larger metal ions from the salt bath. In one embodiment, the temperature of the molten salt bath is about 400-430° C. and the predetermined time period is about four to about eight hours. The incorporation of the larger ions into the glass or glass ceramic substrate strengthens the substrate by creating a compressive stress in a near surface region or in regions at and adjacent to the surface(s) of the substrate. A corresponding tensile stress is induced within a central region or regions at a distance from the surface(s) of the substrate to balance the compressive stress. Glass or glass ceramic substrates utilizing this strengthening process may be described more specifically as chemically-strengthened or ion-exchanged glass or glass ceramic substrates.

In one example, sodium ions in a strengthened glass or glass ceramic substrate are replaced by potassium ions from the molten bath, such as a potassium nitrate salt bath, though other alkali metal ions having larger atomic radii, such as rubidium or cesium, can replace smaller alkali metal ions in the glass. According to particular embodiments, smaller alkali metal ions in the glass or glass ceramic can be replaced by Ag+ ions. Similarly, other alkali metal salts such as, but not limited to, sulfates, phosphates, halides, and the like may be used in the ion exchange process.

The replacement of smaller ions by larger ions at a temperature below that at which the glass network can relax produces a distribution of ions across the surface(s) of the strengthened substrate that results in a stress profile. The larger volume of the incoming ion produces a compressive stress (CS) on the surface and tension (central tension, or CT) in the center of the strengthened substrate. The compressive stress is related to the central tension by the following relationship:

$$CS = CT\left(\frac{t - 2DOL}{DOL}\right)$$

where t is the total thickness of the strengthened glass or glass ceramic substrate and compressive depth of layer (DOL) is the depth of exchange. Depth of exchange may be described as the depth within the strengthened glass or glass ceramic substrate (i.e., the distance from a surface of the glass substrate to a central region of the glass or glass ceramic substrate), at which ion exchange facilitated by the ion exchange process takes place.

In one embodiment, a strengthened glass or glass ceramic substrate can have a surface compressive stress of 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened glass or glass ceramic substrate may have a compressive depth of layer 15 µm or greater, 20 µm or greater (e.g., 25 µm, 30 µm, 35 µm, 40 µm, 45 µm, 50 µm or greater) and/or a central tension of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened glass or glass ceramic substrate has one or more of the following: a surface compressive stress greater than 500 MPa, a depth of compressive layer greater than 15 µm, and a central tension greater than 18 MPa.

Without being bound by theory, it is believed that strengthened glass or glass ceramic substrates with a surface compressive stress greater than 500 MPa and a compressive depth of layer greater than about 15 µm typically have greater strain-to-failure than non-strengthened glass or glass ceramic substrates (or, in other words, glass substrates that have not been ion exchanged or otherwise strengthened).

Example glasses that may be used in the substrate may include alkali aluminosilicate glass compositions or alkali aluminoborosilicate glass compositions, though other glass compositions are contemplated. Such glass compositions may be characterized as ion exchangeable. As used herein, "ion exchangeable" means that a substrate comprising the composition is capable of exchanging cations located at or near the surface of the substrate with cations of the same valence that are either larger or smaller in size. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol. % $SiO_2$; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $\leq (Li_2O+Na_2O+K_2O) \leq 20$ mol. % and 0 mol. % $\leq (MgO+CaO) \leq 10$ mol. %.

A still further example glass composition suitable for the substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $\leq (Li_2O+Na_2O+K_2O) \leq 18$ mol. % and 2 mol. % $\leq (MgO+CaO) \leq 7$ mol. %.

In a particular embodiment, an alkali aluminosilicate glass composition suitable for the substrate comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $((Al_2O_3+B_2O_3)/\Sigma modifiers) > 1$, where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $((Al_2O_3+B_2O_3)/\Sigma modifiers) > 1$.

In still another embodiment, the substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. % $\leq SiO_2+B_2O_3+CaO \leq 69$ mol. %; $Na_2O+K_2O+B_2O_3+MgO+CaO+SrO > 10$ mol. %; 5 mol. % $\leq MgO+CaO+SrO \leq 8$ mol. %; $(Na_2O+B_2O_3)-Al_2O_3 \leq 2$ mol. %; 2 mol. % $\leq Na_2O-Al_2O_3 \leq 6$ mol. %; and 4 mol. % $(Na_2O+K_2O)-Al_2O_3 \leq 10$ mol. %.

In an alternative embodiment, the substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate includes a crystalline substrate, the substrate may include a single crystal, which may include $Al_2O_3$. Such single crystal substrates are referred to as sapphire. Other suitable materials for a crystalline substrate include polycrystalline alumina layer and/or or a spinel ($MgAl_2O_4$).

Optionally, the crystalline substrate may include a glass ceramic substrate, which may be strengthened or non-strengthened. Examples of suitable glass ceramics may include $Li_2O$—$Al_2O_3$—$SiO_2$ system (i.e. LAS-System) glass ceramics, MgO—$Al_2O_3$—$SiO_2$ System (i.e. MAS-System) glass ceramics, and/or glass ceramics that include a predominant crystal phase including β-quartz solid solution, β-spodumene ss, cordierite, and lithium disilicate. The glass ceramic substrates may be strengthened using the glass substrate strengthening processes disclosed herein. In one or more embodiments, MAS-System glass ceramic substrates may be strengthened in $Li_2SO_4$ molten salt, whereby $2Li^+$ for $Mg^{2+}$ exchange can occur.

The substrate according to one or more embodiments can have a thickness in the range from about 100 µm to about 5 mm. Example substrate thicknesses range from about 100 µm to about 500 µm (e.g., 100, 200, 300, 400 or 500 µm). Further example substrate thicknesses range from about 500 µm to about 1000 µm (e.g., 500, 600, 700, 800, 900 or 1000 µm). The substrate may have a thickness greater than about 1 mm (e.g., about 2, 3, 4, or 5 mm). In one or more specific embodiments, the substrate may have a thickness of 2 mm or less or less than 1 mm. The substrate may be acid polished or otherwise treated to remove or reduce the effect of surface flaws.

Anti-Fingerprint Surface

In one or more embodiments, the anti-fingerprint surface may be formed on at least a portion of one or both major surfaces 110, 120 of the substrate 101 or one or more minor surfaces 130, 140 of the substrate. In some embodiments, the anti-fingerprint surface may be formed on at least a portion of one, two, three or all of the surfaces of the substrate. In some instances, the anti-fingerprint surface may be formed on all of one or more surfaces of the substrate 101. In some embodiments, the anti-fingerprint surface may be formed in a predetermined design. For example, the enclosure may include a design occupying a portion of a surface, and the anti-fingerprint surface may be formed on the surface to cover or be disposed adjacent to the design. The design on the enclosure may be provided by a film disposed on one major surface of the substrate and the anti-fingerprint surface may be formed on the opposite major surface, having the same shape as the design.

The anti-fingerprint surface may include a textured surface (or surface that has been modified to include a texture), a coating, or a combination thereof (i.e., a coated textured surface). The anti-fingerprint surface or article including the anti-fingerprint surface may exhibit a haze (in transmittance, in reflectance or both transmittance and reflectance) in the range from about 0.5% to about 40%, from about 0.5% to about 35%, from about 0.5% to about 30%, from about 0.5% to about 25%, from about 0.5% to about 20%, from about 0.5% to about 15%, from about 1% to about 20%, from about 5% to about 35%, from about 10% to about 35%, from about 15% to about 35%, from about 20% to about 35%, or from about 25% to about 35%. The anti-fingerprint surface or article including the anti-fingerprint surface may exhibit a transmittance haze of about 20% or greater, about 30% or greater, or about 40% or greater. The transmittance haze may be up to about 50%. In one or more embodiments, the anti-fingerprint surface or article including the anti-fingerprint surface may exhibit a reflectance haze of about 20% or greater, about 30% or greater, or about 40%. In some instances, the reflectance haze may be up to about 50%. Reflectance haze may be measured at 2 degrees from specular or 5 degrees from specular. In some embodiments, haze may be measured according to ASTM E430.

In embodiments that utilize a textured surface to form the anti-fingerprint surface, the textured surface may include features disposed on the surface that are light-scattering, create a roughness or a combination thereof. The features may be disposed directly on the surface or indirectly on the surface in a random or non-random manner. Randomly disposed features may provide a smooth touch-feeling when the surface is contacted or swiped with a finger or skin. Specifically, features imparting a degree of roughness can create a smooth touch-feeling that facilitates gliding of fingers or other objects over the surface by limiting the contact area of the finger or object with the textured surface.

In one or more embodiments, the textured surface may exhibit a RMS roughness height (i.e., in the z-direction) in the range from about 0.02 micrometers to about 10 micrometers, from about 0.02 micrometers to about 8 micrometers, from about 0.02 micrometers to about 6 micrometers, from about 0.02 micrometers to about 4 micrometers, from about 0.05 micrometers to about 2 micrometers, from about 0.05 micrometers to about 1 micrometer, or from about 0.1 to about 0.8 micrometers. The RMS roughness height is measured using methods known in the art such as atomic force microscopy (AFM), stylus contact profilometry, and optical interference profilometry. The RMS roughness as described herein is preferentially measured over a sample surface section having dimensions of at least about 0.5 mm by 0.5 mm to capture a representative average including a number of typical surface features in the range from about 10 to about 1000.

In some embodiments, the textured surface may include a low frequency of features, large sized features, or a combination thereof which cause fingerprint oils to collect in between the features (i.e., in the valleys created between the features) of the textured structure. Collection of oils between the features reducing the fraction of the surface that is covered with oil droplets, thus reducing light scattering from the fingerprint oils. In such embodiments, the textured surface may have an RMS roughness height in the range from about 0.05 micrometers to about 1 micrometer.

In some embodiments, the textured surface may have a RMS roughness height that is large enough to significantly reduce transfer of fingerprint oils into the valleys of the structure, thus also reducing light scattering through limiting the fraction of the surface that is covered with oil droplets. Such textured surfaces may have a RMS roughness height in the range from about 1 micrometer to about 10 micrometers.

In some embodiments, the textured surface comprises a lateral spatial period (i.e., in the x-y in-plane direction) in the range from about 0.1 micrometers to about 500 microns, from about 0.1 micrometers to about 400 microns, from about 0.1 micrometers to about 300 microns, from about 0.1 micrometers to about 200 microns, from about 0.1 micrometers to about 100 microns, from about 0.1 micrometers to about 50 microns, from about 0.1 micrometers to about 10 microns, from about 0.5 micrometers to about 500 microns, from about 1 micrometer to about 500 microns, from about 10 micrometers to about 500 microns, from about 50 micrometers to about 500 microns, from about 100 micrometers to about 500 microns, from about 1 micrometer to about 100 micrometers, or from about 10 micrometers to about 50 micrometers.

These roughness parameters and surface profiles can be measured using known techniques such as atomic force microscopy (AFM), stylus contact surface profilometry, optical interference surface profiling, and the like.

The textured surface may be formed by a variety of methods such as wet etching, dry etching, masking and etching, photolithography, and the like. In some embodiments, the textured surface may be formed by chemical etching at least one surface of the substrate. Chemical etching may include applying a mask on selected portions of the surface and removing the exposed portions of the surface by etching sand blasting or grinding. In some embodiments, the mask may be formed by forming precipitates on the surface. In other embodiments, the masking may be achieved by polymer masking, polymer particle masking, or inkjeting a mask, or may utilize a mask formed by photolithography or nanoimprint lithography, a phase-separating polymer mask, a soluble (organic or inorganic) phase embedded in an insoluble polymer mask, an insoluble polymer mask including particles embedded therein or a combination thereof. Where etching is used, the etchants may comprise hydrofluoric acid or hydroxide material such as KOH or NaOH plus chelating agents. Hydrofluoric acid may be combined with other acids such as hydrocholoric, sulfuric, acetic, or nitric acids, where minimizing the formation of precipitate formation is desired and/or where etching the surface of the substrate without changing the resulting surface composition is desired. In some embodiments, enclosures with a textured surface may be formed into different shapes through polishing or hot-forming, which may be performed either before or after the texturing process. In other embodiments, an enclosure with a textured surface may be strengthened (as described below) after the textured surface is formed.

In one or more embodiments, the textured surface may be formed by adding features to the surface of the substrate (especially in the case of organic substrates). The features may include particles that are attached or bonded to the surface. In some embodiments, an adhesive may be utilized to bond the particles to the surface. In other embodiments, the particles may be directly bonded to the surface. The particles may have an average major dimension in the range from 100 nanometers to about 2 micrometers. The particles may be formed from the same material as the substrate, or from a different material.

In one or more embodiments, the textured surface may include a coating or coatings disposed on the textured surface, forming a coated textured surface. The coatings may be placed on top of the textured surface to provide various functionalities. The coatings may include ink coatings, hardcoatings, scratch-resistant coatings, low-friction coatings, high-friction coatings, oleophobic coatings, oleophilic coatings, hydrophobic or hydrophilic coatings, decorative coatings, reflective coatings, or anti-reflective coatings or coatings that show a combination of these functions. The specific choice of coating depends on the desired uses of the electronic device, as well as design considerations. In some cases the coatings may be relatively thick (e.g., in the range from about 1 micrometer to about 3 micrometers, in the case of scratch-resistant coatings), or may be relatively thin (e.g., in the range from about 0.5 nanometers to about 50 nanometers, in the case of oleophobic or oleophilic coatings).

In one or more embodiments, the textured surface imparts oleophilicity to the substrate surface (without a coating disposed thereon) and thus forms an anti-fingerprint surface. In one or more embodiments, the textured surface enhances or promotes the oleophilicity of certain substrate, such as glass and some glass ceramic substrates. Without being bound by theory, it is believed that this enhanced oleophilicity provides anti-fingerprint functionality because the visibility of a fingerprint on a surface is largely determined by light scattering, and in turn this light scattering is largely dependent on the size of the scattering oil droplets left behind by a fingerprint. Oleophobic surfaces, such as those commonly used in non-textured display cover substrates, tend to create a large number of fingerprint droplets having an average major dimension of 2 micrometers or less. As used herein and with respect to the phrase "average major dimension", the word "average" refers to a mean value and the word "major dimension" is the greatest dimension of the particle as measured by optical or other known means for measuring such droplets. Such droplets are highly light scattering droplets and thus increase the visibility of the fingerprint. In contrast, oleophilic surfaces tend to create smears or very broad droplets that are larger than 5 micrometers in size, with much reduced light scattering, particularly at scattering angles greater than about 5 degrees away from the specular reflection angle. Accordingly, it is believed a textured surface exhibiting oleophilicity provides improved anti-fingerprint performance.

In some embodiments, the textured surface includes a low-friction coating that is also at least somewhat oleophilic forming an oleophilic coated textured surface. Such coated textured surfaces can provide a smooth gliding surface for fingers but also provide some spreading of oil droplets to further minimize light scattering. In some examples, coated textured surfaces including a low-friction coating exhibit a coefficient of friction of less than 0.3, when measured against a silicon carbide sphere counter surface. Examples of low-friction oleophilic coatings may include glass surface reactive porous alkyl siloxanes (e.g., methyl siloxane, ethyl siloxane, propyl siloxane, and the like), porous phenyl siloxanes, porous alkyl silanes, inorganic coatings (such as alumina, titania, zirconia, aluminum titanium nitride) or combinations thereof. In one or more alternative embodiments, the textured surface may include a high-friction coating forming a coated textured surface. Examples of such high-friction coatings include alkyl siloxanes (e.g., methyl siloxane, ethyl siloxane, propyl siloxane, and the like), phenyl siloxanes, alkyl silanes and other similar materials. In some examples, the coated textured surface with a high-friction coating may exhibit a coefficient of friction of 0.3 or greater, when measured against a silicon carbide sphere counter surface.

In some instances, a bare textured surface (without any coating) exhibits an oleophilicity that decreases with use, as oils, dirt and fingerprints accumulate on the textured surface. In some embodiments, the textured surface includes a coating that maintains a certain degree of oleophilicity. Such coatings can include $TiO_2$, which is believed to be a "self-cleaning" material after exposure to ultraviolet light. Specifically, $TiO_2$ coatings can chemically break down absorbed oils and dirt after exposure to ultraviolet light or even sunlight through photocatalysis.

Enclosures according to one or more embodiments may be free of a textured surface but include a coating forming the anti-fingerprint surface. Such coatings impart oleophilicity to the surface.

In one or more embodiment, the anti-fingerprint surface exhibits an anti-fingerprint functionality such that, after a wipe of a finger or other applicator containing oil or oleic acid, the surface includes droplets that have an average major dimension of greater than about 2 micrometers, greater than about 5 micrometers, or greater than about 10 micrometers.

The anti-fingerprint functionality of the textured surface may also be evaluated by optical methods and by evaluating the visibility or a color shift of an area including a fingerprint and an area not including a fingerprint, as will be described below. Such visibility or color shift may be determined by placing an enclosure having an anti-fingerprint surface on a black, white, or colored background (or laminated to a colored material), with the opposing surface from the anti-fingerprint surface in contact with the background, and illuminating the textured surface from a particular illumination angle or range of angles, using known methods. A collimated or semi-collimated beam of light from a broadband light source (such as found in many optical devices including some image projectors) may be used to illuminate the textured surface. The illuminant can include standard illuminants as determined by the CIE, including A illuminants (representing tungsten-filament lighting), B illuminants (representing daylight simulating illuminants), C illuminants (representing daylight simulating illuminants), D series illuminants (representing natural daylight), and F series illuminants (representing various types of fluorescent lighting). A fingerprint is then applied in a random fashion or a controlled fashion to the anti-fingerprint surface. A controlled fashion may include using a synthetic fingerprint replica which is pressed on an oil-infused cloth with a controlled force, then pressed onto the glass test sample with a controlled force. The optical visibility of the resulting fingerprint is then evaluated using a camera system and software that can compare the brightness and/or color levels of the fingerprinted area to a non-fingerprinted area of the sample. It can be desirable to compare these images when collected at different angles referenced to the specular reflection angle (i.e. the mirror reflection angle of the incoming light source). For example, the images may be collected at 5 degrees, 10 degrees, 20 degrees, 30 degrees, 40 degrees, 50 degrees, or 60 degrees away from the specular reflection angle of the light source. These images can then be processed to compare the brightness and color of the fingerprinted area to the non-fingerprinted area. It may be desirable to average at least 10 brightness and color values for a given fingerprint area (e.g. 10%, 20%, or 50% of the fingerprint area) to reduce measurement noise.

The visibility, based on brightness, may be calculated by the following equation, where the subscript 1 indicates an area including a fingerprint and subscript 2 indicates an area without a fingerprint: the absolute value of the difference (brightness$_1$−brightness$_2$), divided by the sum (brightness$_1$+brightness$_2$). In some embodiments, the texture surface exhibits a visibility of less than about 0.99, less than about 0.95, less than about 0.8, less than about 0.7, less than about 0.6, less than 0.5, less than 0.25, less than 0.2, less than 0.1, less than 0.05 at certain selected angles.

Color shift may be evaluated by comparing the color point of the fingerprinted area to the non-fingerprinted area of the textured glass, as described above. As used herein, the phrase "color shift" refers to the change in both a* and b* values, under the CIE L*, a*, b* colorimetry system, in reflectance or transmittance. Specifically, the color shift is evaluated as a change in b* value, or a change in a* value, or the equation: $\sqrt{((a_1^*-a_2^*)^2+(b_1^*-b_2^*)^2)}$, at certain selected angles, where the subscript 1 indicates an area including a fingerprint and subscript 2 indicates an area without a fingerprint. In one or more embodiments, the textured surface exhibits a color shift of less than about 20, less than about 10, less than about 5, less than about 2, less than about 1, or less than about 0.2, after application of a fingerprint to the textured surface, as described above.

Enclosure

In one or more embodiments, the enclosure may be transparent, translucent, or opaque. In embodiments of a transparent enclosure, such enclosures may exhibit an average total transmittance (taking into account both the interior and exterior surface of the enclosure of about 80% or greater, 85% or greater, 90% or greater, or 95% or greater, over the visible spectrum. In some instances, the enclosure may exhibit an average total transmittance in the range from about 80% to about 96%, from about 80% to about 94%, or from about 80% to about 92%, over the visible spectrum. As used herein, the term "transmittance" is defined as the percentage of incident optical power within a given wavelength range transmitted through a material (e.g., the enclosure or portions thereof). Transmittance is measured using a specific linewidth. In one or more embodiments, the spectral resolution of the characterization of the transmittance is less than 5 nm or 0.02 eV. As used herein, the "visible spectrum" includes the wavelength range from about 420 nm to about 700 nm.

In some embodiments, the enclosure may be translucent and may exhibit an average total transmittance in the range from about 20% to about 80%, from about 25% to about 80%, from about 30% to about 80%, from about 35% to about 80%, from about 40% to about 80%, from about 45% to about 80%, from about 30% to about 75%, from about 30% to about 70%, from about 30% to about 65%, or from about 30% to about 60%. In alternative embodiments, the enclosure may be opaque and have an average total transmittance of less than about 20%. In one or more embodiments, the enclosure permits some light transmission from within the electronic device (even when the enclosure does not cover a display). In such embodiments, the enclosure may permit viewing of the internal components of the electronic device, or may incorporate a photovoltaic component that can be used to charge the electronic device.

In one or more embodiments, the enclosure also exhibits 4-point bend strength, stiffness or Young's Modulus, hardness, crack indentation threshold, thermal conductivity, and strength (in terms of depth of compressive layer (DOL), surface compressive stress and central tension).

In one or more embodiments, the enclosure permits transmission of wireless data transmission or wireless charging energy. In some embodiments, the enclosure exhibits both radio and microwave frequency transparency, as defined by a loss tangent of less than 0.03 and at a frequency range of between 15 MHz to 3.0 GHz. In another exemplary embodiment the article, particularly the electronic device enclosure exhibits radio and microwave frequency transparency, as defined by a loss tangent of less than 0.015 over the frequency range of between 500 MHz to 3.0 GHz. This radio and microwave frequency transparency feature is especially important for wireless hand held devices that include antennas internal to the enclosure. This radio and microwave transparency allows the wireless signals to pass through the enclosure/housing enclosure and in some cases enhances these transmissions. Furthermore, it may also be desirable to be transparent in the infrared to allow wireless optical communication between electronic devices; specifically an infra-red transparency of greater than 80% at wavelengths in the range from about 750 to about 2000 nm. In other embodiments, the enclosure is permits transmission of magnetic fields and/or inductive fields.

The enclosure may also exhibit various mechanical attributes for use with portable electronic devices. For example, some embodiments of the enclosure exhibit any one or more of: a fracture toughness of greater than 0.6 MPa·m$^{1/2}$, a 4-point bend strength of greater than 350 MPa, a Vickers hardness of at least 600 kgf/mm$^2$ and a Vickers median/radial crack initiation threshold of at least 5 kgf, a Young's Modulus in the range from about 50 GPa to about 100 GPa, a thermal conductivity of less than 2.0 W/m° C. In some embodiments, the enclosure exhibits a combination of fracture toughness in excess of 0.6 MPa·m$^{1/2}$, the above-recited Vickers hardness/indentation threshold, and 4-point bend strength. In one or more embodiments, the enclosure exhibits a fracture toughness of greater than 0.70 MPa·m$^{1/2}$, and an 4-point bend strength of greater than 475 MPa or greater than 525 MPa and a Young's Modulus in the range from about 50 GPa to about 75 GPa.

The enclosure described herein may deform upon indentation primarily by densification rather than by shear faulting. In some embodiments, the enclosure is free of subsurface faulting and radial cracks upon deformation. In some embodiments, such as when the substrate utilized is strengthened, the resulting enclosure is more resistant to crack initiation by shear faulting. In one embodiment, the enclosure comprises a strengthened substrate and exhibits a Vickers median/radial crack initiation threshold of at least 5 kilogram force (kgf). In a second embodiment, the enclosure has a Vickers median/radial crack initiation threshold of at least about 10 kgf or at least about 30 kgf.

In one or more embodiments, the enclosure exhibits a thermal conductivity of less than 2 W/m° C., and thus, remains cool to the touch even in high operating temperatures (e.g., temperatures approaching 100° C.). In some embodiments, the enclosure exhibits a thermal conductivity of less than 1.5 W/m° C. For comparison, ceramics such as alumina may exhibit thermal conductivities as high as 29 W/m° C.

EXAMPLES

Various embodiments will be further clarified by the following examples.

Example 1

Figure 2:
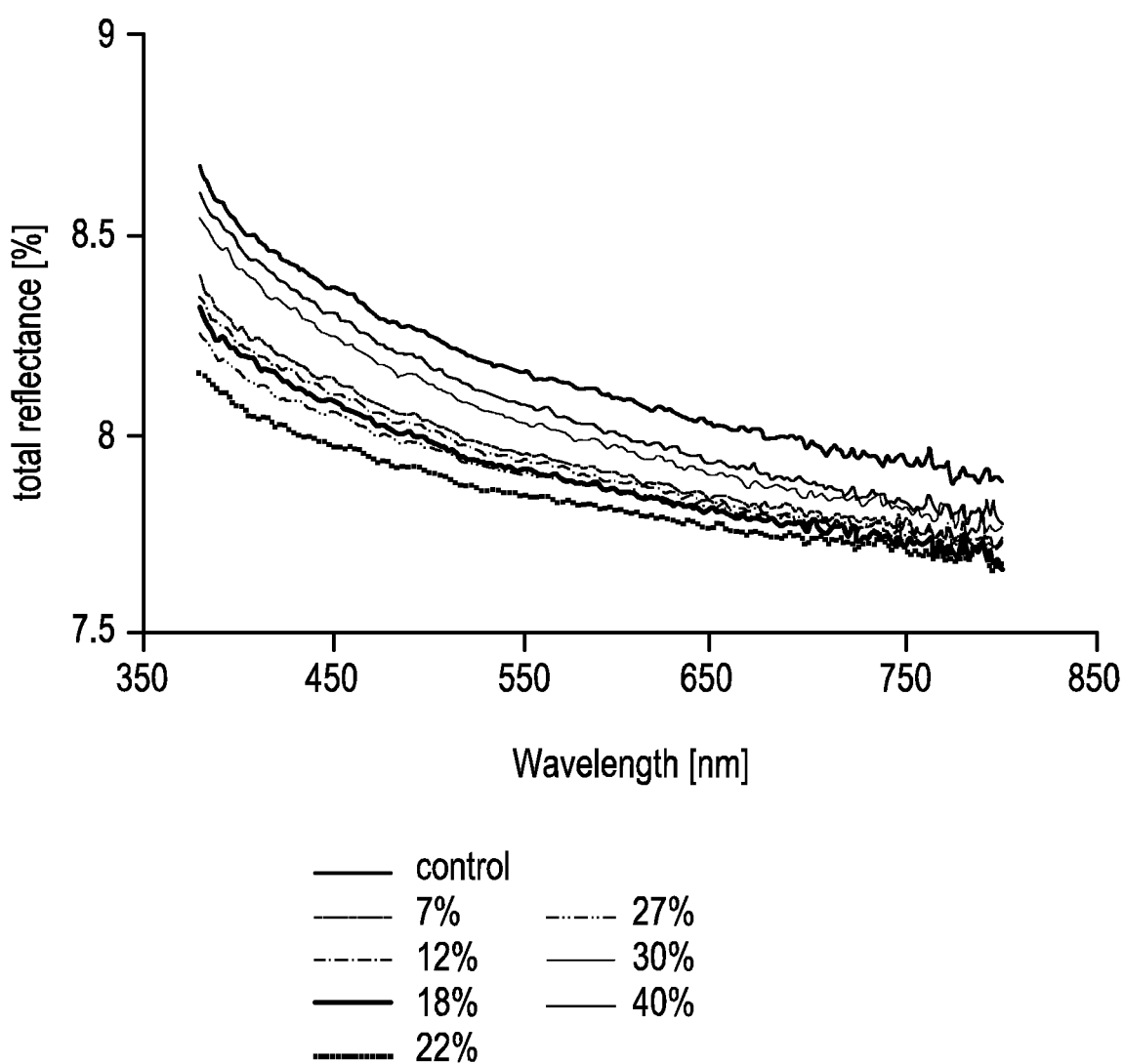
FIG. 2 is a graph plotting total reflectance versus wavelength of a control enclosure and enclosures exhibiting different transmission haze levels.
Figure 3:
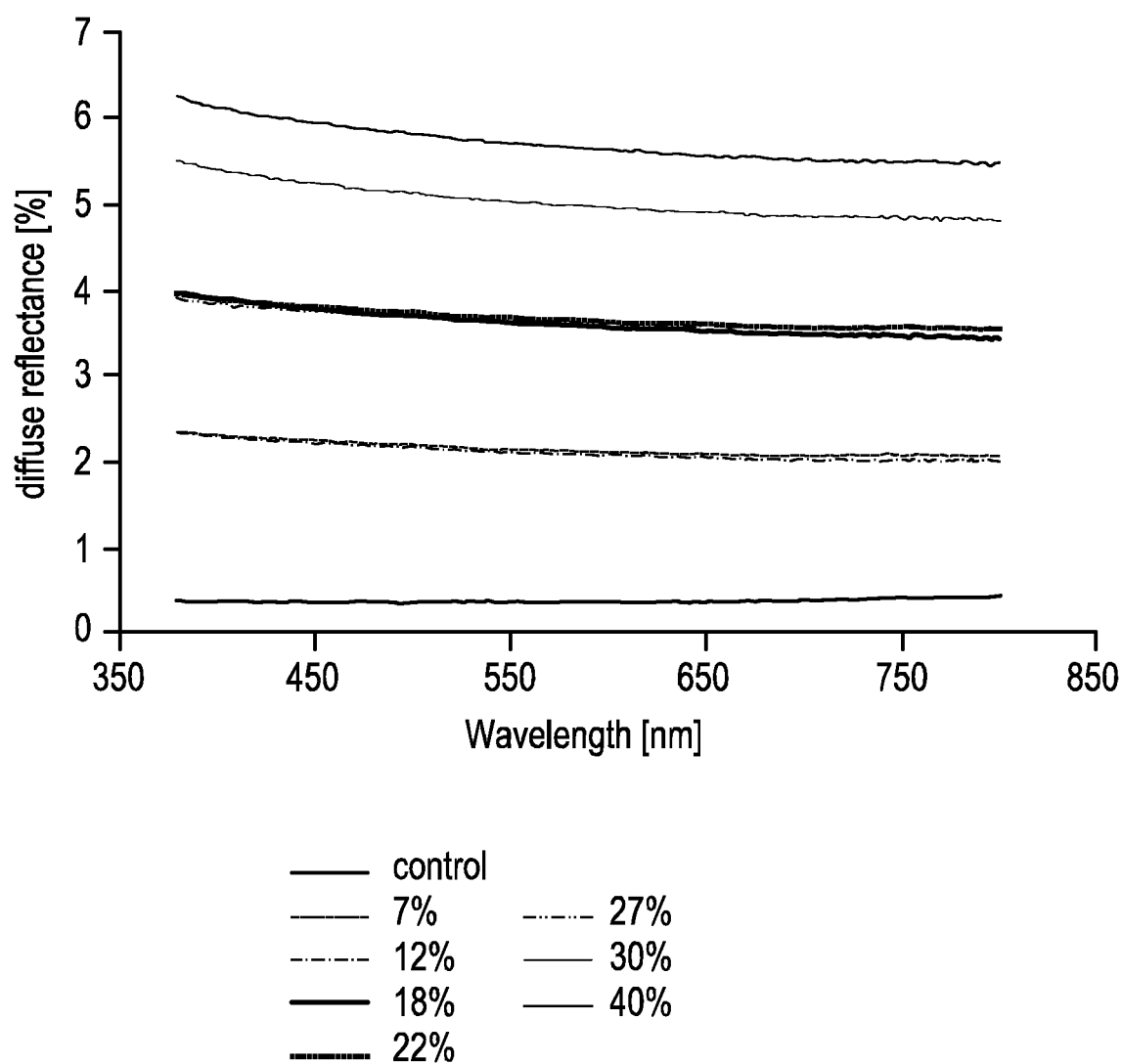
FIG. 3 is a graph plotting diffuse reflectance versus wavelength of the enclosures shown in FIG. 2.

Eight enclosures were formed from glass substrates having a composition including about 68 mol % $SiO_2$, 3.5 mol % $B_2O_3$, 13 mol % $Al_2O_3$, 13.5 mol % $Na_2O$, and about 2 mol % MgO. Seven substrates were sandblasted, followed by chemical etching, on one major surface to form a textured surface exhibiting various haze levels (e.g., 7%, 12%, 18%, 22%, 27%, 30% and 40%). The sandblasting process utilized glass beads having a major dimension in the range from about 1 micrometer to about 100 micrometers, entrained in forced air having a pressure of about 30 psi. The major surface of the substrates was sandblasted for a sufficient duration of time (e.g., from about 1 minute to about 20 minutes) and then etched using HF as an etchant, to create the various haze levels (with longer sandblasting times used to achieve lower haze levels). Each of the seven substrates included an opposing, non-textured major surface. One substrate was not etched and was used as a control. The total reflectance (including specular and diffuse reflectance) of both the textured surface and the non-textured surface of each of the enclosures was potted against wavelength (nm), as shown in FIG. 2. As shown in FIG. 2, the total reflectance does not change significantly as a function of haze. FIG. 3 shows the diffuse reflectance of both the textured surface and the non-textured surface of each of the enclosures was potted against wavelength (nm). As shown in FIG. 3, the change in diffuse reflectance increases with increasing haze, but not necessarily proportionally. For example, the enclosures with 18% haze, 22% haze, and 27% haze have about the same diffuse reflectance and the enclosures with 7% haze and 12% haze have about the same diffuse reflectance.

Figure 4:
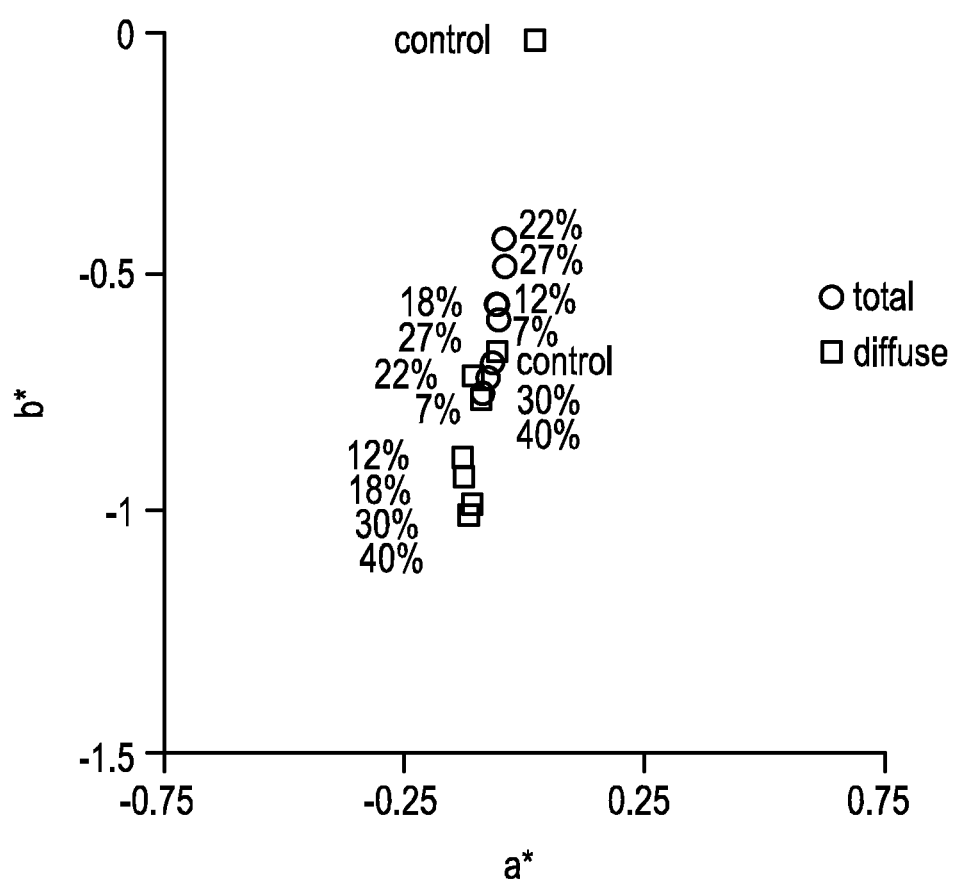
FIG. 4 is a graph plotting the total reflectance a* and b* color values and diffuse reflectance a* and b* color values of the enclosures shown in FIG. 2.

The total reflectance a* and b* color values as described by the CIE L*, a*, b* colorimetry system (and standards literature) and the diffuse reflectance (within a radius of about 0.25 of the targeted color coordinates, e.g., a substrate with zero transmission haze) a* and b* color values of both the textured surface and non-textured surface of the eight enclosures was measured at the same angle (with respect to one another) under a D65 illuminant. FIG. 4 shows the plotted a* and b* values for a series of transmission haze levels.

Figure 5:
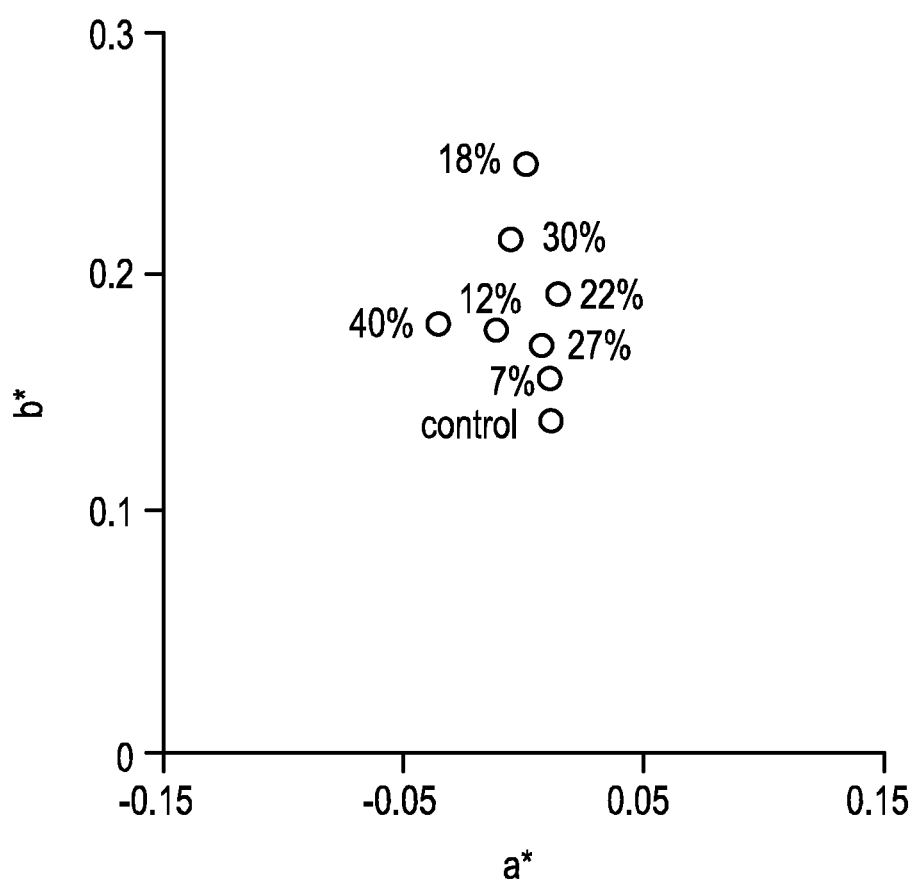
FIG. 5 is a graph plotting the total transmittance a* and b* color values of the enclosures shown in FIG. 2.

The total transmitted a* and b* color values of both the textured surface and non-textured surface of the eight enclosures was measured at the same angle (with respect to one another) under a D65 illuminant. FIG. 5 shows the plotted a* and b* values.

FIG. 6 shows the calculated total reflectance color shift and diffuse reflectance color shift of the control enclosure against the seven enclosures having a textured surface using the equation: $\sqrt{((a^*_{control}-a^*_{haze})^2+(b^*_{control}-b^*_{haze})^2)}$, at certain selected angles, where the subscript "control" indicates the control enclosure and the subscript "haze" indicates the enclosure having a textured surface with some haze. As shown in FIG. 6, the color shift is less than 1 in all instances, indicating the textured surface does not impart any significant color to the enclosure FIG. 7 shows the total transmittance color shift ("DC*") of the control enclosure against the seven enclosures having a textured surface using the equation: $DC^*=\sqrt{((a^*_{control}-a^*_{haze})^2+(b^*_{control}-b^*_{haze})^2)}$, at certain selected angles, where the subscript "control" indicates the control enclosure and the subscript "haze" indicates the enclosure having a textured surface with some haze. FIG. 7 also shows the total transmittance color shift (DE*), taking into account the color coordinate L*, of the control enclosure against the seven enclosures having a textured surface using the equation: $DE^*=\sqrt{((L^*_{control}-L^*_{haze})+(a^*_{control}-a^*_{haze})^2+(b^*_{control}-b^*_{haze})^2)}$, at certain selected angles, where the subscript "control" indicates the control enclosure and the subscript "haze" indicates the enclosure having a textured surface with some haze. As shown in FIG. 7, the color shift is less than 1 in all instances, indicating the textured surface does not impart significant color to the enclosure.

Various modifications and variations can be made to the materials, methods, and articles described herein. Other aspects of the materials, methods, and articles described herein will be apparent from consideration of the specification and practice of the materials, methods, and articles disclosed herein. It is intended that the specification and examples be considered as exemplary.

We claim:

1. An electronic device enclosure comprising:
   a substrate comprising an anti-fingerprint surface comprises a textured surface comprising particles attached or bonded to the anti-fingerprint surface, the textured surface is oleophilic, and the textured surface comprises a RMS roughness height in the range from about 0.05 micrometers to about 10 micrometers,
   wherein the anti-fingerprint surface exhibits a haze in the range of about 0.5% to about 40%,
   wherein, when a fingerprint is applied to the anti-fingerprint surface, the anti-fingerprint surface exhibits a color shift of less than about 20, and
   wherein the enclosure exhibits any one or more of:
      radio and microwave frequency transparency, as defined by a loss tangent of less than 0.03 and at a frequency range of between 15 MHz to 3.0 GHz;
      magnetic field transparency;
      inductive field transparency; and
      infrared transparency.

2. The electronic device enclosure of claim 1, wherein the enclosure exhibits any one or more of:
   a fracture toughness of greater than 0.60 $MPam^{1/2}$;
   a 4-point bend strength of greater than 350 MPa;
   a Vickers hardness of at least 450 $kgf/mm^2$;
   a Vickers median/radial crack initiation threshold of at least 5 kgf;
   a Young's Modulus in the range from about 50 GPa to about 100 GPa; and
   a thermal conductivity of less than 2.0 W/m° C.

3. The electronic device enclosure of claim 2, wherein the enclosure exhibits radio and microwave frequency transparency, as defined by a loss tangent of less than 0.015 at a frequency range of between 500 MHz to 3.0 GHz.

4. The electronic device enclosure of claim 2, wherein the enclosure exhibits any one or more of
   a fracture toughness of greater than 0.75 $MPam^{1/2}$, and
   a Young's Modulus in the range from about 50 GPa to about 75 GPa.

5. The electronic device enclosure of claim 2, wherein the enclosure exhibits an 4-point bend strength of greater than 475 MPa.

6. The electronic device enclosure of claim 2, wherein the enclosure exhibits a Vickers hardness of at least 500 kgf/mm$^2$ and Vickers median/radial crack initiation threshold of greater than 10 kgf.

7. The electronic device enclosure of claim 2, wherein the enclosure exhibits a thermal conductivity of less than 1.5 W/m° C.

8. The electronic device enclosure of claim 1, wherein the enclosure exhibits an average transmittance of about 80% or greater over a wavelength range from about 400 nm to about 750 nm.

9. The electronic device enclosure of claim 1, wherein the enclosure exhibits an average transmittance of about 80% or greater over a wavelength range from about 750 nm to about 2000 nm.

10. The electronic device enclosure of claim 1, wherein the substrate comprises an amorphous substrate or a crystalline substrate.

11. The electronic device enclosure of claim 1, wherein the substrate is strengthened comprises any one or more of
    a compressive surface layer having a depth of layer (DOL) greater than or equal to 20 μm,
    a compressive stress greater than 400 MPa, and
    a central tension of more than 20 MPa.

12. The electronic device enclosure of claim 10, wherein the crystalline substrate comprises a strengthened glass ceramic substrate, a non-strengthened glass-ceramic, or a single crystal substrates.

13. The electronic device enclosure of claim 1, further comprising an electronic device selected from a mobile phone, a tablet, a laptop, and a media player.

14. The electronic device enclosure of claim 1, wherein the anti-fingerprint surface exhibits a visibility of less than about 0.95.

15. The electronic device enclosure of claim 1, wherein the particles comprise an average major dimension in a range from 100 nanometers to about 2 micrometers.

16. The electronic device enclosure of claim 1, wherein the textured surface comprises TiO$_2$.

17. The electronic device enclosure of claim 1, wherein the haze is in a range from about 10% to about 35%.

18. The electronic device enclosure of claim 1, wherein the substrate comprises any one of a soda lime glass, an alkali aluminosilicate glass, or an alkali aluminoborosilicate glass, and the particles comprise the same material as the substrate.

19. The electronic device enclosure of claim 1, wherein the particles comprise the same material as the substrate.

20. An electronic device enclosure comprising:
    a substrate comprising an anti-fingerprint surface comprises a textured surface comprising particles attached or bonded to the anti-fingerprint surface, the textured surface is oleophilic,
    wherein the anti-fingerprint surface exhibits a haze in the range from about 10% to about 35%,
    wherein, when a fingerprint is applied to the anti-fingerprint surface, the anti-fingerprint surface exhibits a color shift of less than about 20, and
    wherein the enclosure exhibits any one or more of:
        radio and microwave frequency transparency, as defined by a loss tangent of less than 0.03 and at a frequency range of between 15 MHz to 3.0 GHz;
        magnetic field transparency;
        inductive field transparency; and
        infrared transparency.

21. An electronic device enclosure comprising:
    a substrate comprising an anti-fingerprint surface comprises a textured surface comprising particles attached or bonded to the anti-fingerprint surface, the textured surface is oleophilic,
    wherein the particles comprise of the same material as the substrate,
    wherein the anti-fingerprint surface exhibits a haze in the range of about 0.5% to about 40%,
    wherein, when a fingerprint is applied to the anti-fingerprint surface, the anti-fingerprint surface exhibits a color shift of less than about 20, and
    wherein the enclosure exhibits any one or more of:
        radio and microwave frequency transparency, as defined by a loss tangent of less than 0.03 and at a frequency range of between 15 MHz to 3.0 GHz;
        magnetic field transparency;
        inductive field transparency; and
        infrared transparency.

* * * * *